US008374662B2

(12) United States Patent
Hull (10) Patent No.: US 8,374,662 B2
(45) Date of Patent: Feb. 12, 2013

(54) PARTICLE TRAP EMPLOYING A HIGH TEMPERATURE SUPERCONDUCTOR AND AN ASSOCIATED METHOD OF TRAPPING PARTICLES

(75) Inventor: John Ralph Hull, Sammamish, WA (US)

(73) Assignee: The Boeing Company, Chicago, IL (US)

( * ) Notice: Subject to any disclaimer, the term of this patent is extended or adjusted under 35 U.S.C. 154(b) by 506 days.

(21) Appl. No.: 12/728,692

(22) Filed: Mar. 22, 2010

(65) Prior Publication Data

US 2011/0230355 A1 Sep. 22, 2011

(51) Int. Cl.
*H01L 39/02* (2006.01)
*H01J 49/02* (2006.01)

(52) U.S. Cl. ........ 505/150; 505/400; 505/848; 250/292; 250/281; 250/282

(58) Field of Classification Search .................. 505/100, 505/125, 150, 300, 400, 480, 700, 780, 848; 250/281–300, 489, 396 R
See application file for complete search history.

(56) References Cited

U.S. PATENT DOCUMENTS

| 3,485,716 | A | 12/1969 | Bodner | |
|---|---|---|---|---|
| 5,379,000 | A | 1/1995 | Brewer et al. | |
| 5,469,323 | A | 11/1995 | Kanayama | |
| 5,477,046 | A | 12/1995 | Dietrich et al. | |
| 6,025,769 | A | * 2/2000 | Chu et al. | 335/216 |
| 6,630,666 | B2 | 10/2003 | Greaves | |
| 6,803,569 | B2 | * 10/2004 | Tsybin et al. | 250/292 |
| 2004/0242429 | A1 | * 12/2004 | Cha et al. | 505/100 |

OTHER PUBLICATIONS

Danielson, J.R., et al.; "A Cryogenic, High-field Trap for Large Positron Plasmas and Cold Beams"; AIP Conference Proceedings; No. 692; 2003;pp. 149-161; XP-002647921.*
Brown, L. S. et al., *Geonium Theory: Physics of a Single Electron or Ion in a Penning Trap*, Reviews of Modern Physics, vol. 58, No. 1, Jan. 1986, pp. 233-311.
Danielson, J. R. et al., *Radial Compression and Torque-Balanced Steady States of Single-Component Plasmas in Penning-Malmberg Traps*, Physics of Plasmas, No. 13, 055706 (2006), 10 pages.
Dubin, D. H. E et al., *Trapped Nonneutral Plasmas, Liquids, and Crystals (The Thermal Equilibrium States)*, Reviews of Modern Physics, vol. 71, No. 1, Jan. 1999, pp. 87-172.
Hull, J. R. et al., *Applications of Bulk High-Temperature Superconductors*, Proceedings of the IEEE, vol. 92, No. 10, Oct. 2004, pp. 1705-1718.
International Search Report and Written Opinion for International Application No. PCT/US2011/022727, mailed Jul. 26, 2011.
Bertsche, W., et al.; "A magnetic trap for antihydrogen confinement"; Nuclear Instruments & Methods in Physics Research; Section A; Elsevier; Amsterdam, NL; vol. 566; No. 2; Oct. 15, 2006; pp. 746-756; XP-025056433.

(Continued)

*Primary Examiner* — Stanley Silverman
*Assistant Examiner* — Kallambella Vijayakumar
(74) *Attorney, Agent, or Firm* — Alston & Bird LLP (57) ABSTRACT

A particle trap and an associated method of trapping particles are provided. The particle trap includes a body formed of a high temperature superconductor (HTS). The body defines a cavity therethrough. The particle trap also includes first and second HTS end plates or first and second electrodes positioned at opposite ends of the cavity. At least one of the end plates or at least one of the electrodes defines at least one opening into the cavity to permit charged particles to enter and exit the cavity.

20 Claims, 4 Drawing Sheets

OTHER PUBLICATIONS

Tomita, M., et al.; "High-temperature superconductor bulk magnets that can trap magnetic fields of over 17 tesla at 29 K"; Nature; vol. 421; No. 6922; Jan. 30, 2003; pp. 517-520; XP-002647922.

Testera, G., et al.; "A combined sextupole-Malmberg-Penning trap for cold non neutral plasmas and anti-hydrotgen"; AIP Conference Proceedings; vol. 862; No. 1; 2006; pp. 153-163; XP-002647923.

Sarid, E., et al.; "Decay of the Diocotron Rotation and Transport in a New Low-Density Asymmetry-Dominated Regime"; Physical Review Letters; vol. 89; No. 10; Sep. 2, 2002; pp. 422-432; XP-002647924.

Amoretti, M., et al.; "The ATHENA antihydrogen appartus"; Nuclear Instruments & Methods in Physics Research; Section A; vol. 518; No. 3; Feb. 11, 2004; pp. 679-711; XP-004488180.

* cited by examiner

PARTICLE TRAP EMPLOYING A HIGH TEMPERATURE SUPERCONDUCTOR AND AN ASSOCIATED METHOD OF TRAPPING PARTICLES

FIELD

Embodiments of the present disclosure relate generally to particle traps and associated methods for trapping charged particles and, more particularly, to particle traps employing a high temperature superconductor and associated methods for trapping charged particles utilizing such traps.

BACKGROUND

The trapping and storage of charged particles has been studied for many years. See, for example, L. S. Brown and G. Gabrielse, Rev. Mod. Phys., Vol. 58, pp. 233-311 (1986) and D. H. E. Dubin and T. M. O'Neil, Rev. Mod. Phys., Vol. 71, pp. 87-172 (1999). In addition to basic plasma physics studies, trapped single-component plasmas may have a number of uses including uses in atomic clocks, the tailoring of positron beams for material characterization and the production of low-energy anti-hydrogen. See, for example, J. R. Danielson and C. M. Surko, Phys. Plasmas, Vol. 13, 055706 (2006).

Several traps have been developed for trapping and storing charged particles. For example, Penning traps and, more generally, Malmberg-Penning traps have been developed. A Malmberg-Penning trap is a cylindrically symmetric device that is utilized to confine non-neutral plasmas with both a uniform axial magnetic field that confines the plasma radially and electrostatic fields at the opposed ends of the trap to confine the plasma axially. These traps usually have cylindrical electrodes to generate the electrostatic fields that allow diagnostic access.

In Malmberg-Penning traps, the charged particles within the trap rotate in circles about the magnetic field such that the charged particles are confined radially. The radius r of the circles in which the charged particles rotate is defined as follows:

$$r = (m v)/(e B)$$

where m is the mass of a particle, v is a particle velocity, e is the charge of the particle and B is the value of the magnetic field. The velocity of the particles is generally determined by the temperature of the surroundings since the charged particles moving in the circular rotation exchange heat with the surroundings via radiation. At a temperature of 4 K, for example, the thermal velocity of an electron is about 8 km/s and the radius in a 2 T magnetic field is about 44 nm.

The charged particles may experience a small drag torque while moving in the circular rotation. Although not wishing to be bound by any particular theory, the drag torque may be caused by azimuthal inhomogeneities in the magnetic and electric fields of the trap. The drag torque disadvantageously causes the radius of the circular rotation pattern of a charged particle to increase such that the position of the charged particle migrates towards the walls of the trap. Ultimately, the charged particle may collide with the wall of the trap and the charged particle may escape from the trap. As a result, the lifetime of the charged particles within the trap may be less than desired in some instances. In order to counter the drag torque, some traps apply a rotating electric field that applies torque in the opposite direction to the drag torque. Unfortunately, the application of the rotating electric field adds to both the cost and complexity of the resulting trap.

BRIEF SUMMARY

A particle trap and an associated method of trapping particles are therefore provided according to embodiments of the present disclosure which address at least some of the issues associated with conventional particle traps. For example, a particle trap and an associated method for trapping particles may be provided in accordance with one embodiment which advantageously permit the lifetime of the charged particles within the trap to be increased and/or which permit the particle density for which the particle trap remains stable to be higher. In addition, the particle trap and associated method for trapping particles in accordance with one embodiment may be less susceptible to distortions in the magnetic field and/or to azimuthal inhomogeneities in the trap, thereby potentially resulting in improved trapping and storage of charged particles.

In accordance with one embodiment, a particle trap is provided that includes a body comprised of a high temperature superconductor (HTS). The body defines a cavity therethrough and, in one embodiment, defines a plurality of cavities therethrough. The particle trap of this embodiment also includes first and second end plates positioned at opposite ends of the cavity. The first and second end plates are also comprised of HTS. The first end plate of this embodiment defines at least one opening into the cavity.

The cavity of one embodiment defines a central axis extending between first and second end plates. In this embodiment, the at least one opening defined by the first end plate may be offset from the central axis. Additionally, the first end plate of this embodiment may define a second opening aligned with the central axis. The particle trap may also include an electrode positioned proximate the at least one opening.

The particle trap of one embodiment may also include a clamp configured to hold the first and second end plates in position relative to the body. As noted above, the cavity may define a central axis extending between the first and second end plates. In one embodiment, the body has a magnetic field extending in the direction defined by the central axis. In this embodiment, the particle trap may also include means for cooling the body and the first and second end plates to a temperature less than a predefined critical temperature of the HTS such that the magnetic field of the body continues to extend in the direction defined by the central axis.

In another embodiment, a particle trap is provided that includes a body comprised of the high temperature superconductor (HTS). The body defines a cavity therethrough and, in one embodiment, defines a plurality of cavities therethrough. The particle trap also includes a body electrode in electrical contact with the body and first and second electrodes positioned at opposite ends of the cavity. In this embodiment, the first electrode defines at least one opening into the cavity.

The first and second electrodes of one embodiment extend across opposite ends of the cavity. In this embodiment in which the cavity defines a central axis extending between the first and second electrodes, the at least one opening defined by the first electrode is aligned with the central axis. In another embodiment, the first and second electrodes are cylindrical and encircle respective ends of the cavity. In instances in which the cavity defines the central axis extending between the first and second electrodes, the first and second electrodes of this embodiment are aligned with the central axis.

As noted above, the cavity may define a central axis extending between the first and second ends of the cavity and the body of one embodiment may have a magnetic field extending in the direction defined by the central axis. In this embodiment, the particle trap may also include means for cooling the body to a temperature less than a predefined critical temperature of the HTS such that the magnetic field of the body continues to extend in the direction defined by the central axis.

In a further embodiment, a method for trapping particles is provided that includes providing a particle trap having a body formed of a high temperature superconductor (HTS). The body defines a cavity therethrough that has a central axis extending between opposite ends of the cavity. In accordance with the method, a magnetic field is provided that extends in the direction defined by the central axis. The method of this embodiment also receives charged particles through one end of the cavity and urges the charged particles toward the central axis in response to diamagnetic properties of the HTS.

In providing the particle trap, the method of one embodiment may provide first and second end plates positioned at opposite ends of the cavity and comprised of HTS. As such, receiving the charged particles in accordance with this embodiment may include receiving charged particles through at least one opening defined by the first end plate into the cavity. The first end plate of this embodiment may also define a second opening into the cavity with at least one electrode positioned proximate at least one of the openings into the cavity. The method of this embodiment may therefore also apply voltage to the electrodes to either attract or repel the charged particles based upon the relationship of the voltage applied to the electrode relative to the charge maintained by the charged particles.

In another embodiment, providing the particle trap may include providing first and second electrodes positioned at opposite ends of the cavity. In this embodiment, receiving the charged particles may include receiving charged particles through at least one opening defined by the first electrode into the cavity. The method of this embodiment may also include applying a voltage to at least one of the first and second electrodes to either attract or repel the charged particles based upon a relationship of the voltage applied to the electrode relative to the charge maintained by the charged particles.

The features, functions and advantages that have been discussed may be achieved independently in various embodiments of the present disclosure or may be combined in yet other embodiments, further details of which may be seen with reference to the following description and drawings.

BRIEF DESCRIPTION OF THE SEVERAL VIEWS OF THE DRAWING(S)

Having thus described embodiments of the present disclosure in general terms, reference will now be made to the accompanying drawings, which are not necessarily drawn to scale, and wherein:

DETAILED DESCRIPTION

The present disclosure now will be described more fully hereinafter with reference to the accompanying drawings, in which some, but not all embodiments are shown. Indeed, the disclosure may be embodied in many different forms and should not be construed as limited to the embodiments set forth herein; rather, these embodiments are provided so that this disclosure will satisfy applicable legal requirements. Like numbers refer to like elements throughout.

A particle trap 10 is provided in accordance with embodiments of the present invention for trapping and storing charged particles. The particles that are trapped may consist of one species or multiple species, but generally have the same charge, regardless of the species. For example, the particle trap of embodiments of the present disclosure may be configured to trap positrons or antiprotons.

The particle trap 10 of embodiments of the present disclosure includes at least a body 12 formed of a high temperature superconductor (HTS). HTS is generally defined as a material that has a superconducting transition temperature above 30 K. In one embodiment, the HTS may produce the magnetic field that serves to trap the particles. Additionally, the HTS material has a diamagnetic property that serves to stabilize the orbits of the charged particles.

Figure 1:
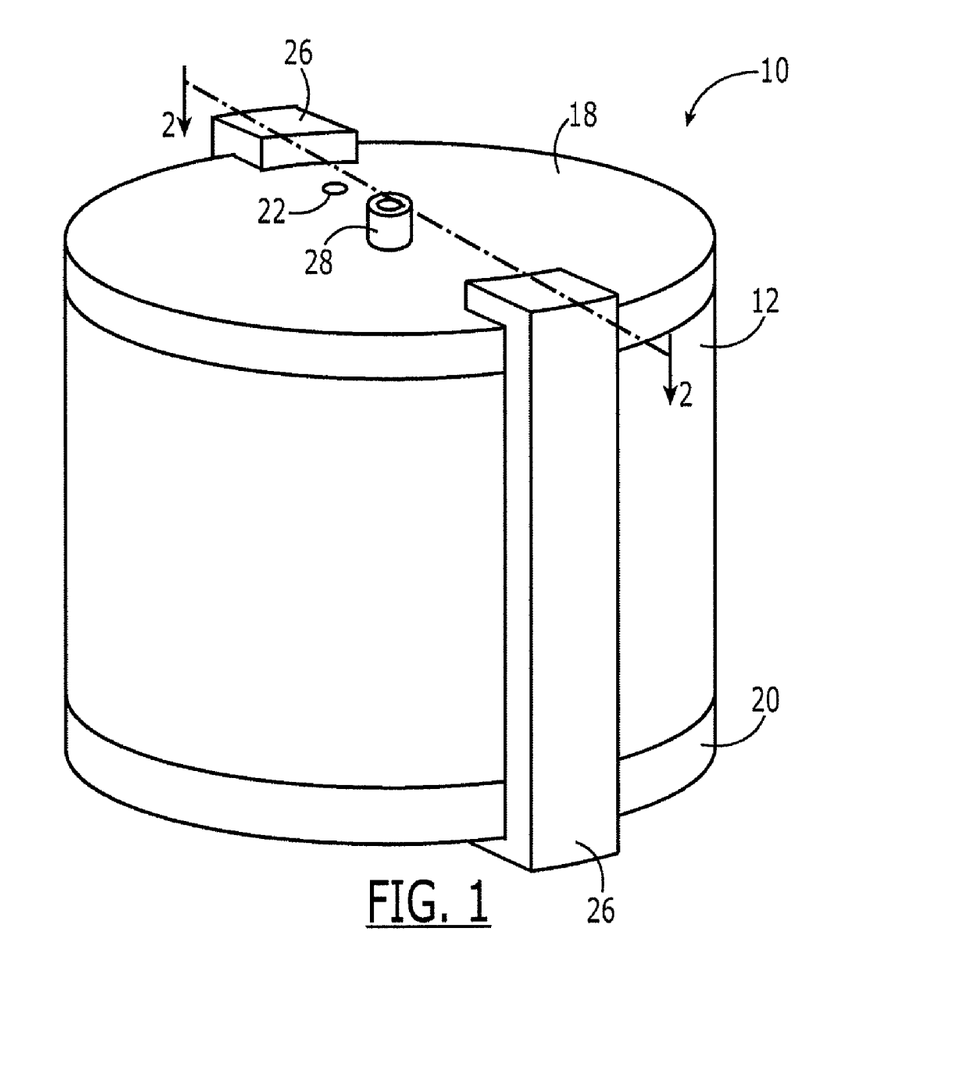
FIG. 1 is a perspective view of a particle trap in accordance with one embodiment to the present disclosure.
Figure 2:
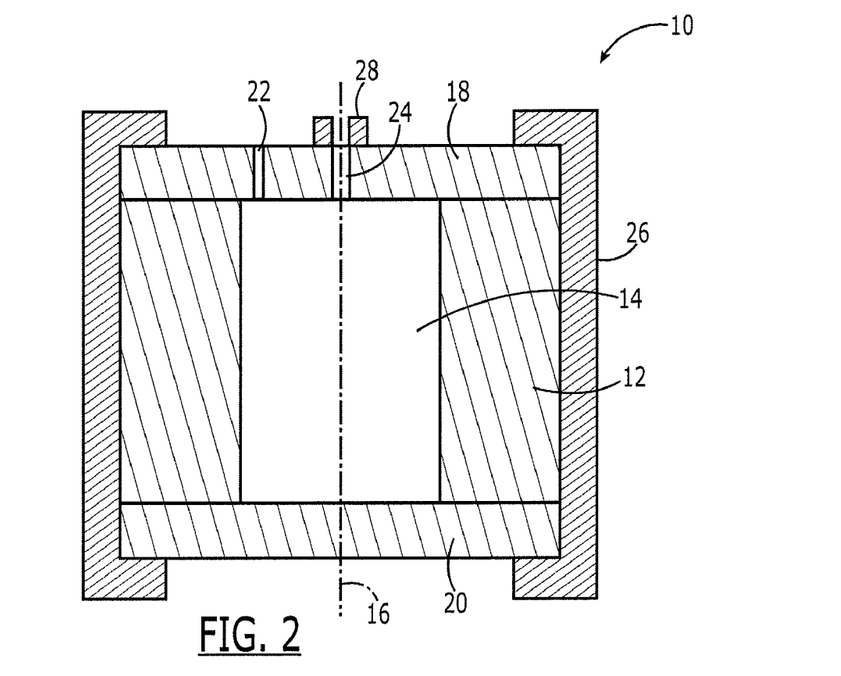
FIG. 2 is a cross-sectional view of the particle trap of FIG. 1 taken along line 2-2 of FIG. 1.

Although the particle trap 10 may be constructed in various forms, the particle trap of one embodiment is shown in FIG. 1 and, in cross-section, in FIG. 2. The particle trap of this embodiment includes a body 12 formed of a HTS. While the particle trap may include various types of HTS, the body of one embodiment may be formed of a single-grain Y—Ba—Cu—O (YBCO) superconductor. As shown in FIG. 2, the body defines a cavity 14 therethrough. While the body will be described and illustrated herein as including a single cavity, the body of other embodiments may define a plurality of cavities in order to permit the density of the stored particles to be increased relative to embodiments that include a single cavity. Although the cavity may have different shapes, the body of the illustrated embodiment defines a cylindrical cavity which, in turn, defines a central axis 16 extending between the opposed ends of the cavity as shown in FIG. 2.

In the embodiment of FIGS. 1 and 2, the particle trap 10 also includes first and second end plates 18, 20 positioned at opposite ends of the cavity 14. As shown, the first and second end plates may cover the openings into the cavity defined at the opposite ends of the body 12. Although the first and second end plates are shown to have the same diameter as the body, the end plates may have a diameter that is larger or smaller than the body so long as the first and second end plates cover the opposed ends of the cavity. Like the body, the first and second end plates of this embodiment are formed of HTS, such as the same HTS as that which forms the body.

In the illustrated embodiment, the first end plate 18 defines at least one opening into the cavity 14. In this regard, the first end plate may define one or more openings 22 offset from the central axis 16 such that charged particles may enter through the opening(s) defined by the first plate into the cavity defined by the body 12. As illustrated in FIGS. 1 and 2, the first end plate may also include a second opening 24 aligned with the central axis. As shown, the second end plate 20 may be solid so as not to define any openings into the cavity. However, the second end plate of another embodiment may include one or more openings including an opening offset from the central axis and/or an opening aligned with the central axis as described above in conjunction with the first end plate. The openings through the end plate(s) may be sized depending upon the ease with which particles are to enter and exit the particle trap with larger openings permitting easier, that is, more likely, entry to and exit from the particle trap and smaller openings making it more difficult, that is, less likely, for particles to enter into and exit from the particle trap. Although the particle trap 10 may be constructed in various manners, the particle trap of the illustrated embodiment includes a clamp 26, such as a mechanical clamp, for securing the first and second end plates to the body and for holding the first and second end plates and the body in a fixed relationship with respect to one another.

In one embodiment, the body 12 and the first and second end plates 18, 20 that are formed of HTS are magnetized with the resulting magnetic field being in the direction of the central axis 16 of the cavity 14. For example, the body and the first and second end plates that are formed of HTS may be magnetized by being placed in the magnetic field of an external magnet, such as a superconducting solenoid. The body and the first and second end plates may be aligned within the magnetic field such that the external magnetic field is aligned along the central axis. Additionally, the magnetic field generated by the external magnet may be homogenous over the body and first and second end plates. While exposed to the magnetic field of the external magnet, the body and first and second end plates are cooled to its operating point, that is, the temperature at which the particle trap 10 will be maintained while trapping and storing charged particles. In this regard, the HTS has a predefined critical temperature, such as 90 K. As such, the operating point to which the body and the first and second end plates are cooled is a temperature less than or below the critical temperature of the HTS, such as 77 K.

The body 12 and the first and second end plates 18, 20 may be cooled in various manners, such as by attaching a thermally conductive member from the cold head of a cryo-cooler to the clamp 26. Alternatively, all or at least a portion of the clamp may be submerged in a liquid cryogen or the external surfaces of the particle trap 10 may be exposed to cold gas.

Regardless of the manner in which the particle trap 10 is cooled, once the body 12 and the first and second end plates 18, 20 reach the operating point, the magnetic field provided by the external magnet may be terminated and the magnetic field will remain trapped in the HTS. So long as the HTS is held at its operating point, the magnetic field will remain in the HTS, even if the HTS is moved to a different location. Thus, the particle trap may also include means, such as a cryo-cooler, a liquid cryogen or a source of cold gas, for cooling the body and the first and second end plates to the operating point less than the predefined critical temperature of the HTS. While maintained at this operating point, the magnetic field of the body and the first and second end plate of one embodiment will extend in the same direction as the magnetic field previously supplied by the external magnet, that is, in a direction defined by and aligned with the central axis 16 of the cavity 14.

In operation, charged particles may enter the trap 10 through the opening(s) 22, 24 defined by the first end plate 18. Upon its entry, the charged particle may have a component of velocity that extends parallel to the central axis 16 of the cavity 14 and another component of velocity that extends in a direction perpendicular to the central axis defined by the cavity. The component of velocity that extends in a direction parallel to the central axis of the cavity will carry the charged particle towards the second end plate 20. As the result of the diamagnetic property of the HTS that forms the second end plate, however, the charged particle will eventually reflect from the second end plate and begin travel back through the cavity towards the first end plate.

While the charged particle is migrating between the first and second end plates 18, 20 the charged particle that enters the cavity with any component of velocity in a direction perpendicular to the central axis 16 of the cavity 14 will also cause the charged particle to orbit about the central axis. As a result of the diamagnetic properties of the body 12 that influences the radius about which the charged particle orbits the central axis of the cavity, the radius of the orbit about which the particle is encircling the central axis of the cavity will have migrated between the time at which the charged particle entered the cavity through the opening 22 defined by the first end plate and the time at which the charged particle returns to the first end plate following a reflection from the second end plate. As such, on its return to the first end plate, the charged particle will have migrated in position so as to interact with a solid portion of the first end plate rather than remaining aligned with the same opening through which the charged particle entered the cavity. As such, the charged particle is effectively trapped and stored within the cavity defined by the particle trap 10.

As a result of the diamagnetic properties of the HTS that forms the body 12, the orbit of a charged particle will eventually migrate toward the central axis 16. As such, the diamagnetic property of the HTS that forms the body and the first and second end plates 18, 20 may serve to stabilize the orbits of the charged particles. In this regard, the diamagnetic properties of the HTS will cause a charged particle traveling close to the wall of the particle trap 10 to experience a force that will urge it toward this central axis. This force generated by the diamagnetic properties of the HTS will become progressively stronger the closer the charged particle is to the wall and will tend to zero near the central axis of the cavity 14. As a result of the forces imparted to the charged particles by the diamagnetic properties of the HTS, the particle trap need not utilize a rotating electric field to stabilize the particle distribution as required by at least some conventional particle traps, thereby simplifying the design of the particle trap. Additionally, the forces imparted upon the charged particles by the diamagnetic properties of the HTS may also advantageously increase the lifetime of the trapped particles within the particle trap and permit a higher particle density to be established within the particle trap.

In instances in which the first and/or second end plate 18, 20 defined an opening 24 aligned with the central axis 16, the charged particles may impinge upon the respective end plate proximate the opening once the charged particles have migrated toward the central axis. By forming the opening that is aligned with the central axis of the cavity 14 to either have a relatively small diameter or relatively large diameter, the particle trap 10 may permit a lesser number or a greater number, respectively, of particles to escape.

In one embodiment, an electrode 28 may be positioned proximate one or each opening 22, 24 defined by the first end plate 18. As shown in FIGS. 1 and 2, for example, an electrode may be positioned proximate the opening defined by the first end plate that is aligned with the central axis 16 of the cavity 14. In one embodiment, the electrode may have a cylindrical, conical, circular or other annular shape, and may be positioned so as to encircle the respective opening. This electrode may help to control the exit of charged particles from the particle trap 10. In one embodiment, the clamp 26 may be connected to ground, while the electrode is connected to a voltage source. To facilitate the extraction of charged particles from the particle trap, the voltage that is applied to the electrode has a polarity that is opposite in sign to the sign of the charge of the charged particles. Alternatively, to enhance the trapping of the charged particles, voltage may be applied to the electrode that has a polarity that is the same in sign as the sign of the charge of the charged particles. Although not shown, a similar electrode, such as a cylindrical or circular electrode, may be positioned proximate the opening defined by the first end plate that is offset from the central axis of the cavity.

The particle trap 10 of this embodiment of the present disclosure may therefore trap and store a number of charged particles. As noted above, as a result of its construction utilizing HTS, the lifetime of the particles within the trap may be increased and the particle density for which the trap is stable may be greater than conventional particle traps. Additionally, the particle trap may be less susceptible to distortions in the magnetic field and azimuthal inhomogeneities in the trap. Accordingly, the particle trap of embodiments of the present disclosure may effectively trap and store charged particles and may then controllably release the charged particles.

The HTS that forms the body 12 and the first and second end plates 18, 20 of the particle trap 10 of the embodiment of FIGS. 1 and 2 may be fabricated in various manners. For example, top seeded melt growth (TSMG) may be utilized to fabricate a large, single-grain YBCO superconductor as described, for example, by J. R. Hull and M. Murakami, Proc. IEEE, Vol. 92, pp. 1705-1718 (2004). In this regard, the cavity 14 defined by the HTS may be formed by machining the HTS following its formation, such as by ultrasonic drilling.

Figure 3:
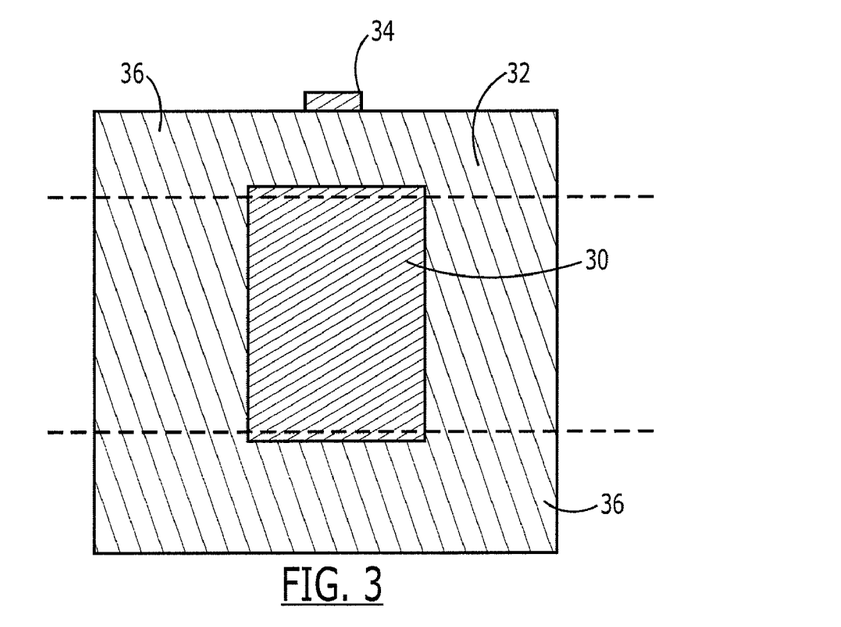
FIG. 3 is a schematic representation illustrating one technique for fabricating the body of a particle trap in accordance with one embodiment to the present disclosure.

Alternatively, the body 12 formed of HTS may be fabricated as shown, for example, in FIG. 3. In this regard, an inert metal 30 may be placed into a powder preform 32 that will be utilized to form the HTS, such as a YBCO powder. The inert metal is advantageously selected so as not to melt at the processing temperature and so as not to interact with the HTS. For example, the inert metal may be formed with an Ag—Au alloy. A seed 34 may then be placed on the powder preform and the material may be processed in accordance with the TSMG process to form the HTS culminating with a structure having the inert metal inside the structure and the seed on an exterior surface of the structure. Following fabrication of the HTS, the resulting structure may be cut along opposite ends of the inert metal, such as along the dashed lines shown in FIG. 3. The cut may be made, for example, with a diamond-tipped saw along lines that are either coplanar with the opposite ends of the inert metal or slightly interior of the inert metal as shown, for example, in FIG. 3. The opposed end portions 36 may then be removed and the remaining portion of the inert metal may be machined out such that the body of a particle trap 10 remains. If so desired, the end portions that are removed following the cutting of the structure may be further machined and openings may be formed in at least one of the end portions so as to form the first and second end plates 18, 20 of the resulting particle trap.

The particle trap 10 may have a cylindrical trap shape as shown in FIGS. 1 and 2. However, the particle trap may have other shapes and sizes in other embodiments. For example, a cylindrical particle trap may have a diameter between 10 and 100 mm and a height that is defined between the exterior surfaces of the first and second end plates 18, 20 of between 20 mm and less than 1 mm. In addition, the diameter of the cavity 14 defined by the body 12 may be between 10 mm and less than 1 micron. In addition to being differently sized, and shaped, the particle trap may be constructed in different manners than that illustrated in conjunction with FIGS. 1 and 2.

For example, the particle trap of FIGS. 1 and 2 includes a body and first and second end plates that are separable from the body. Alternatively, at least one of the first and second end plates may be integral with the body.

Figure 4:
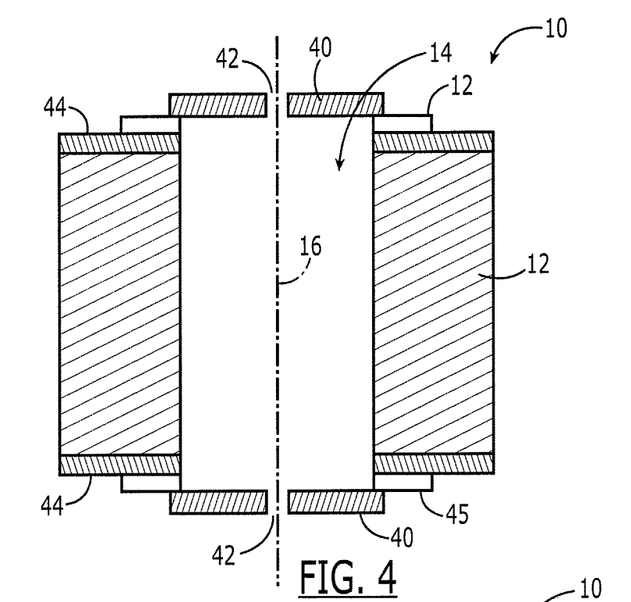
FIG. 4 is a cross-sectional view of a particle trap in accordance with another embodiment of the present disclosure.

Other embodiments of the particle trap 10 may eliminate or differently configure the first and second end plates 18, 20. In this regard, the particle trap of the embodiments of FIGS. 4 and 5 includes a body 12 formed of HTS that defines a cavity 14 therethrough. In contrast to the particle trap of the embodiment of FIGS. 1 and 2, however, the particle trap of the embodiments of FIGS. 4 and 5 includes first and second electrodes 40 positioned at opposite ends of the cavity with at least the first electrode defining at least one opening into the cavity. As shown in FIG. 4, for example, the first and second electrodes may extend across the opposed ends of the cavity. At least the first electrode and, in the illustrated embodiment, both the first and second electrodes may define at least one opening 42 into the cavity, such as an opening aligned with the central axis 16. Additionally, the particle trap may include a body electrode 44 in electrical contact with the body of the particle trap. As shown, one insulator 45 may be positioned between the first electrode and the body electrode and another insulator may be positioned between the second electrodes and the body electrode. The insulators may be formed of a nonmagnetic, non-electrically conductive material, such as a plastic or a glass fiber-reinforced plastic composite.

In order to trap charged particles within the particle trap 10 of this embodiment, voltage is applied to the first and second electrodes 40 that has a polarity that is the same as the charge of the charged particles, while the body electrode 44 is electrically connected to ground. As such, the charged particles will be repelled from the first and second electrodes and will remain within the cavity 14 of the particle trap. Alternatively, if it is desired to extract the charged particles from the cavity of the particle trap, a voltage is applied to at least one of the first and second electrodes that has a polarity that is opposite that of the sign of the charge of the charged particles so that the charged particles are accelerated towards the respective the electrode and through the opening 42 defined therein, while the first and second electrodes may be formed with one or more openings defined therein, the first and second electrodes may, alternatively, have a grid structure with the spaces within the grid defining the openings through which the charged particles enter and exit the cavity.

Figure 5:
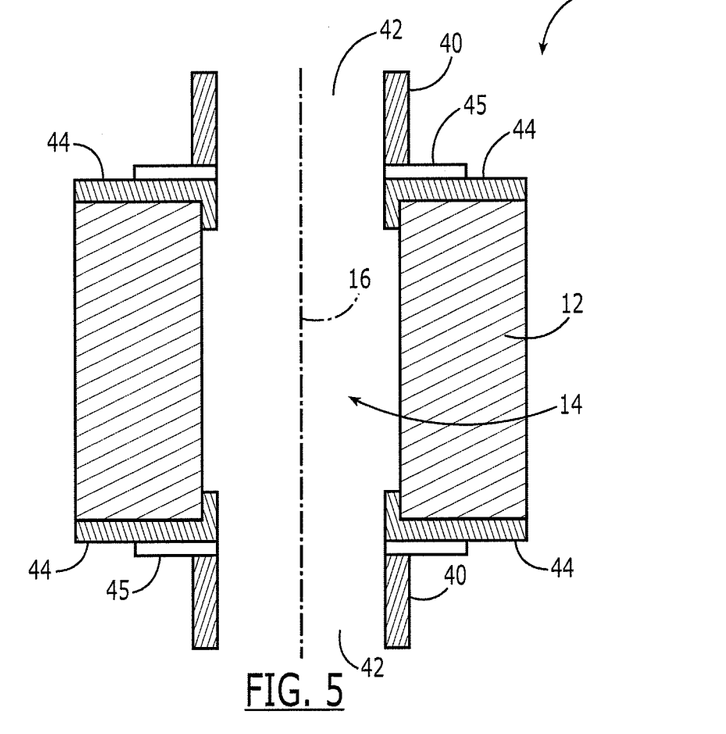
FIG. 5 is a cross-sectional view of a particle trap in accordance with a further embodiment to the present disclosure.

Alternatively, as shown in the embodiment of FIG. 5, the first and second electrodes 40 may be cylindrical and may be positioned so as to encircle a respective end of the cavity 14. In this embodiment, the cylindrical electrodes define relatively large openings into the cavity. However, by appropriately controlling the polarity of the voltage applied to the first and second electrodes relative to the sign of the charge of the charged particles, the particle trap 10 of the embodiment of FIG. 5 may similarly control the retention of the charged particles within the particle trap or, alternatively, the release of the charged particles from the particle trap.

Although not shown in FIGS. 4 and 5, the particle traps 10 of these embodiments may also include mechanical attachments to secure the body 12 and the first and second electrodes 40 in a fixed positional relationship. Although a clamp may be employed as shown in the embodiment of FIGS. 1 and 2, other types of mechanical attachments may be employed. The mechanical attachment is advantageously formed of a nonmagnetic, non-electrically conductive material, such as a plastic or a glass fiber-reinforced plastic composite. For example, the mechanical attachment may be one or more screws or bolts, adhesive or a shrink fitting, such as for cylindrical geometries.

Figure 6:
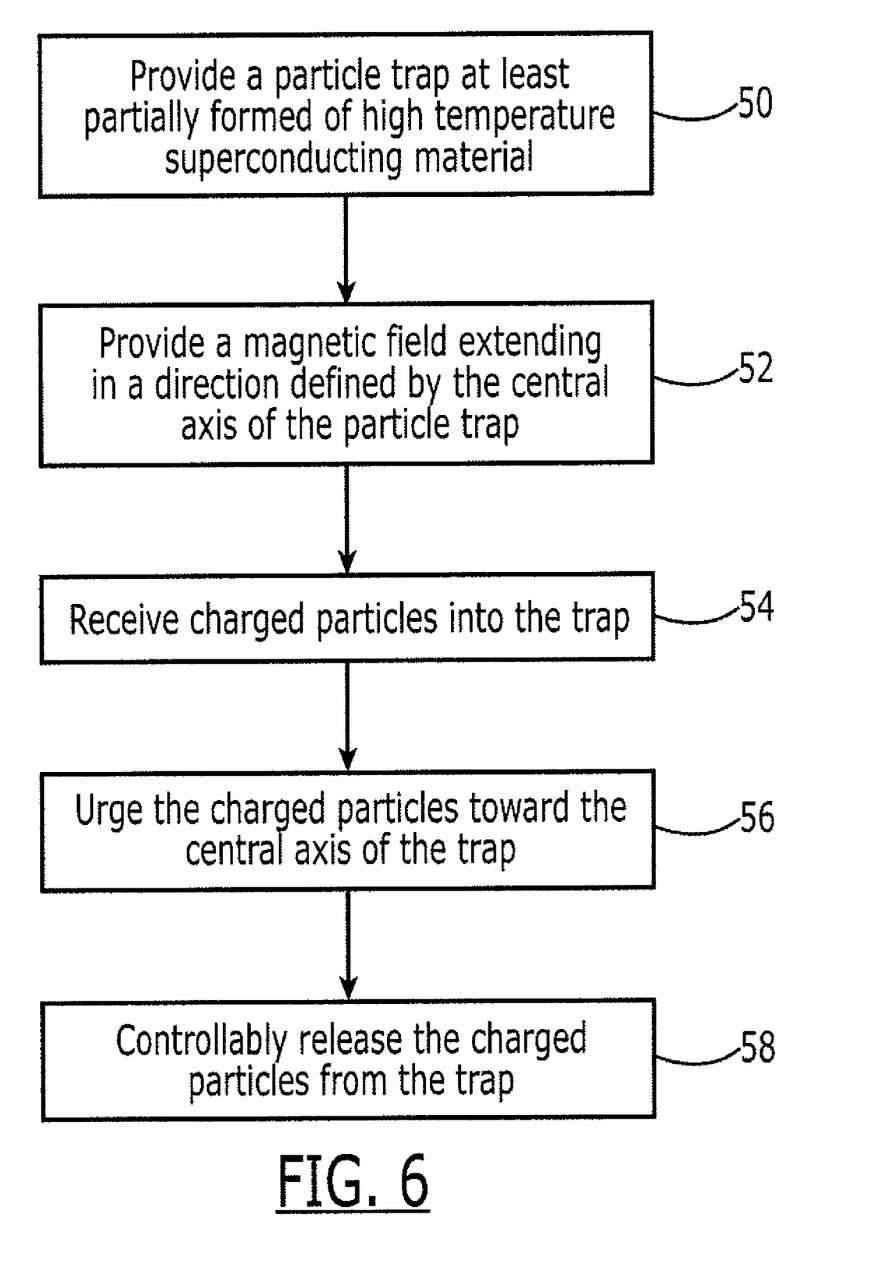
FIG. 6 is a flowchart illustrating operations performed in accordance with one embodiment to the present disclosure.

Regardless of the configuration of the particle trap 10, a method is provided in accordance with embodiments of the present disclosure, as shown in FIG. 6, for trapping charged particles. In this regard, a particle trap is initially provided that includes a body 12 formed of HTS and defining a cavity 14 therethrough that has a central axis 16 extending between opposite ends of the cavity. See operation 50. A magnetic field is provided that extends in the direction defined by the central axis. As noted above and as shown at operation 52, the magnetic field may be provided by the body. Alternatively, the magnetic field may be provided by an external source, such as an external magnet, in which case, the HTS of the body still has the diamagnetic properties that serve to stabilize the orbits of the charged particles. Still further, the magnetic field may be provided by a combination of the magnetic fields provided by the body and an external source. In operation 54, charged particles are received through one end of the cavity. Once within the cavity, the charged particles are urged toward the central axis in response to the diamagnetic property to the HTS, thereby increasing the lifetime of the charged particles within the particle trap and increasing the density of the charged particles that may be stably accommodated within the particle trap. See operation 56. The charged particles may thereafter be controllably released from the particle trap, such as by appropriately energizing an electrode associated with an opening through one end of the cavity. See operation 58.

By trapping and storing the charged particles and then controlling the release of the charged particles, the particle trap 10 of embodiments of the present disclosure may permit the charged particles to be utilized for a variety of purposes. For example, the charged particles may facilitate the study by plasma researchers or others of the charged particles. Additionally, the particle trap may permit positrons or antiprotons to be stored and then released so as to form an antimatter beam or to permit relatively immediate annihilation with adjacent matter so as to generate energy. The resulting reactions could form the motive force for a rocket engine or the current pulses for accelerator beams. Further, the conversion of antimatter to energy may form a relatively lightweight energy storage mechanism that could be useful, for example, in space applications.

Many modifications and other embodiments of the disclosure set forth herein will come to mind to one skilled in the art to which these embodiments pertain having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A particle trap comprising:
    a body comprised of a high temperature superconductor (HTS) material and defining a cavity therethrough; and
    first and second end plates positioned at opposite ends of the cavity, wherein the first and second end plates are also comprised of HTS material, and wherein the first end plate defines at least one opening into the cavity.

2. A particle trap according to claim 1 wherein the cavity defines a central axis extending between the first and second end plates, and wherein the at least one opening defined by the first end plate is offset from the central axis.

3. A particle trap according to claim 2 wherein the first end plate defines a second opening aligned with the central axis.

4. A particle trap according to claim 1 further comprising an electrode positioned proximate the at least one opening.

5. A particle trap according to claim 1 further comprising a clamp configured to hold the first and second end plates in position relative to the body.

6. A particle trap according to claim 1 wherein the cavity defines a central axis extending between the first and second end plates, and wherein the body has a magnetic field extending in a direction defined by the central axis.

7. A particle trap according to claim 6 wherein the HTS material has a predefined critical temperature, and wherein the particle trap further comprises means for cooling the body and the first and second end plates to a temperature less than the predefined critical temperature.

8. A particle trap according to claim 1 wherein the body defines a plurality of cavities therethrough.

9. A particle trap comprising:
    a body comprised of a high temperature superconductor (HTS) material and defining a cavity therethrough;
    a body electrode in electrical contact with the body; and
    first and second electrodes positioned at opposite ends of the cavity, wherein the first electrode defines at least one opening into the cavity.

10. A particle trap according to claim 9 wherein the first and second electrodes extend across opposite ends of the cavity.

11. A particle trap according to claim 10 wherein the cavity defines a central axis extending between the first and second electrodes, and wherein the at least one opening defined by the first electrode is aligned with the central axis.

12. A particle trap according to claim 9 wherein the first and second electrodes are cylindrical and encircle a respective end of the cavity.

13. A particle trap according to claim 12 wherein the cavity defines a central axis extending between the first and second electrodes, and wherein the first and second electrodes are aligned with the central axis.

14. A particle trap according to claim 9 wherein the cavity defines a central axis extending between the first and second ends of the cavity, and wherein the body has a magnetic field extending in a direction defined by the central axis.

15. A particle trap according to claim 14 wherein the HTS material has a predefined critical temperature, and wherein the particle trap further comprises means for cooling the body to a temperature less than the predefined critical temperature.

16. A particle trap according to claim 9 wherein the body defines a plurality of cavities therethrough.

17. A method for trapping particles comprising:
    providing a particle trap comprising a body comprised of a high temperature superconductor (HTS) material and defining a cavity therethrough that has a central axis extending between opposite ends of the cavity;
    providing a magnetic field extending in a direction defined by the central axis;
    receiving charged particles through one end of the cavity; and
    urging the charged particles toward the central axis in response to diamagnetic properties of the HTS material.

18. A method according to claim 17 wherein providing the particle trap comprises providing first and second end plates positioned at opposite ends of the cavity and comprised of HTS material, and wherein receiving charged particles comprises receiving charged particles through at least one opening defined by the first end plate into the cavity.

19. A method according to claim 18 wherein the first end plate further defines a second opening into the cavity with at least one electrode positioned proximate at least one of the openings into the cavity, and wherein the method further comprises applying a voltage to the electrode to either attract or repel the charged particles based upon a relationship of the voltage applied to the electrode relative to a charge maintained by the charged particles.

20. A method according to claim 17 wherein providing the particle trap comprises providing first and second electrodes positioned at opposite ends of the cavity, wherein receiving charged particles comprises receiving charged particles through at least one opening defined by the first electrode into the cavity, and wherein the method further comprises applying a voltage to at least one of the first and second electrodes to either attract or repel the charged particles based upon a relationship of the voltage applied to the at least one electrode relative to a charge maintained by the charged particles.

* * * * *